United States Patent [19]

Mandai et al.

[11] Patent Number: 5,401,910
[45] Date of Patent: Mar. 28, 1995

[54] ELECTRONIC COMPONENT

[75] Inventors: Harufumi Mandai; Noboru Kato; Koji Shiroki, all of Nagaokakyo, Japan

[73] Assignee: Murata Manufacturing Co. Ltd., Kyoto, Japan

[21] Appl. No.: 162,444

[22] Filed: Dec. 3, 1993

[30] Foreign Application Priority Data

Dec. 3, 1992 [JP] Japan .................. 4-324065

[51] Int. Cl.6 ............................... H05K 1/00
[52] U.S. Cl. .................... 174/250; 174/257; 361/784
[58] Field of Search ............. 174/250, 255, 256, 257; 361/752, 757, 784, 790, 792

[56] References Cited

U.S. PATENT DOCUMENTS 5,107,394 4/1992 Naito et al. .
5,227,951 7/1993 de Neuf et al. .
5,251,094 10/1993 Amano et al. .

*Primary Examiner*—Leo P. Picard
*Assistant Examiner*—Cheryl R. Figlin
*Attorney, Agent, or Firm*—Ostrolenk, Faber, Gerb & Soffen

[57] ABSTRACT

A ceramic substrate has a single plating film formed on both wiring electrodes formed on an upper surface of a ceramic body and external electrodes formed on side surfaces and a lower surface of the ceramic body. The plating film on the wiring electrodes and the external electrodes has a first plating layer made of Ni and a second plating layer made of Sn.

15 Claims, 2 Drawing Sheets

ELECTRONIC COMPONENT

BACKGROUND OF THE INVENTION

1. Field of the Invention

The present invention relates generally to a ceramic electronic component, and more particularly, to an improvement in an electronic component having plating films formed on electrodes exposed to its outer surfaces so as to enhance solderability and corrosion resistance.

2. Description of the Prior Art

Examples of ceramic electronic components include a ceramic electronic component having wiring electrodes formed on at least one of its major surfaces and terminal electrodes and the like formed on its side surfaces, for example, a ceramic multilayer substrate. Another example is an alumina substrate for an IC package having electrodes formed on its one major surface and its side surfaces.

The ceramic electronic component having the electrodes on both the major surface and the side surfaces as described above is superior in balance of conductivity, costs and the like and has a relatively high melting point. Accordingly, in the ceramic electronic component, Ag or an Ag-Pd alloy is often used as a material constituting the electrodes. However, Ag or an Ag system alloy is eroded by solder, so that corrosion resistance of the electrodes is insufficient.

Consequently, in the ceramic electronic component using Ag or an Ag system alloy as a material constituting the electrodes exposed to its outer surfaces, the corrosion resistance of the outer electrodes must be enhanced.

Therefore, an attempt to coat the surfaces of the outer electrodes with another conductive material by plating to enhance corrosion resistance of the outer electrodes has been conventionally made. For example, as a ceramic substrate on which a transistor is mounted, a ceramic substrate having plating films made of Au formed on wiring electrodes on its major surface on which the transistor is mounted and plating films made of low-cost Sn formed on electrodes on its side surfaces has been proposed.

Furthermore, as an IC package, an IC package in which overgraze layers are formed on wiring electrodes exposed to the exterior and then, plating films made of Au are formed thereon has been used. Also in the case, plating films made of an Ni-Sn alloy and solder are formed on terminal electrodes.

In the conventional ceramic electronic component having wiring electrodes, terminal electrodes and the like on both its major surface and its side surfaces as described above, plating films are formed on the electrodes so as to enhance corrosion resistance of the electrodes. However, the electrodes formed on the major surface and the electrodes formed on the side surfaces are coated with plating films made of different materials, so that the plating film forming process must be carried out several times, which is very complicated.

SUMMARY OF THE INVENTION

An object of the present invention is to provide an electronic component having plating films formed on electrodes exposed to its outer surfaces so as to enhance corrosion resistance of the electrodes, whose costs can be significantly reduced because the plating films can be formed by a very simple process.

The present invention provides an electronic component comprising a ceramic body having a pair of major surfaces and side surfaces connecting the major surfaces to each other, at least one wiring electrode formed on one of the major surfaces of the ceramic body, at least one electrode formed on at least one of the side surfaces and the other major surface of said ceramic body for electrical connection to the exterior or the interior or for electrical connection to the at least one wiring electrode, and plating films formed on the at least one wiring electrode and the at least one electrode formed on at least one of the side surfaces and the other major surface, and in that at least one plating film on the at least one wiring electrode and at least one plating film the on at least one electrode formed on at least one of the side surfaces and the other major surface are made of the same material.

According to the present invention, the plating films made of the same material are formed on the wiring electrode or electrodes formed on one of the major surfaces and the electrode or electrodes for electrical connection to the interior or the exterior formed on the side surfaces and/or the lower surface. The plating films on the wiring electrodes and the electrodes formed on the side surfaces and/or the lower surface have been conventionally made of different materials, so that the plating process is complicated. On the other hand, in the present invention, the plating films formed on the wiring electrode or electrodes and the other electrode or electrodes are made of the same material as described above, so that the plating process can be significantly simplified, thereby to make it possible to effectively reduce the costs of the electronic component.

Furthermore, the wiring electrode or electrodes and the electrode or electrodes formed on the side surfaces and/or the lower surface can be simultaneously plated. When the electrodes are plated by electroplating, therefore, a voltage is reliably applied to an electrode portion having a small area, provided that the electrode portion is electrically connected to another electrode portion exposed to the outer surface. Accordingly, in the electrode portion having a small area, a plating film having a sufficient thickness can be formed. Consequently, the reliability of the electronic component is enhanced.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
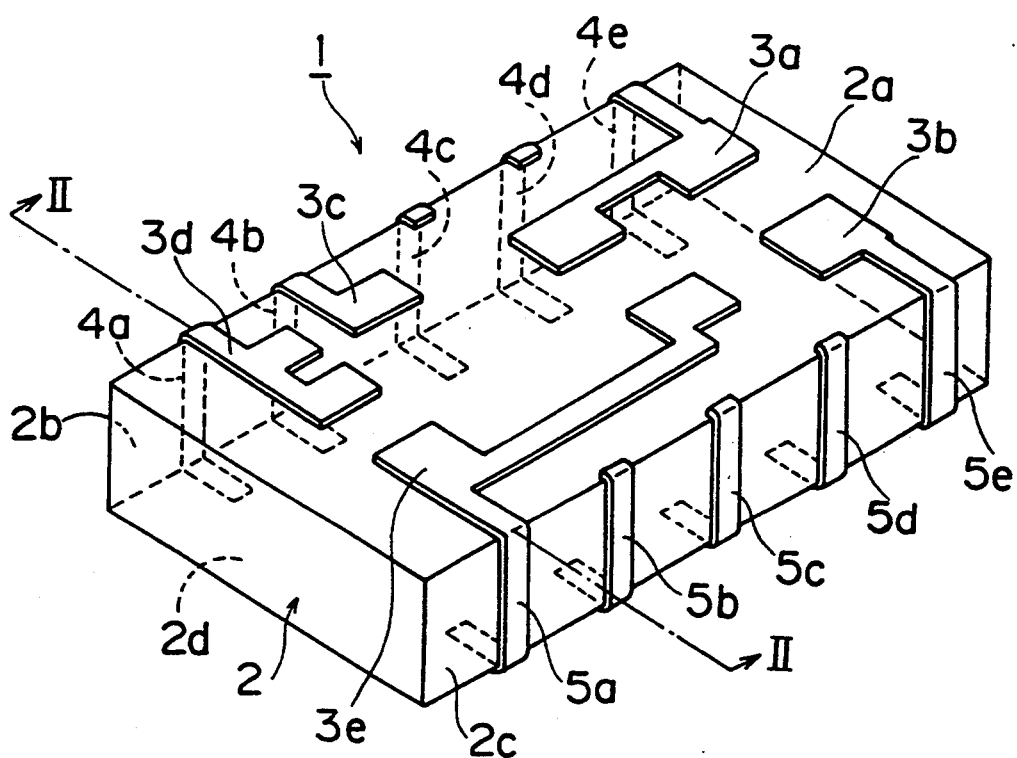
FIG. 1 is a perspective view showing a ceramic substrate serving as an electronic component to which one embodiment of the present invention is applied.

Referring now to the drawings, one embodiment of the present invention will be described to clarify the present invention.

FIG. 1 is a perspective view showing a ceramic multilayer substrate serving as a ceramic electronic component to which one embodiment of the present invention is applied.

A ceramic substrate 1 has a rectangular plate-shaped ceramic body 2. Wiring electrodes 3a to 3e are formed on an upper surface 2a of the ceramic body 2. The wiring electrodes 3a to 3e are completed as electrodes by, for example, applying a conductive plate containing Ag on the surface of the ceramic body 2 after sintering and baking the conductive paste on the ceramic body 2. The plane shapes of the wiring electrodes 3a to 3e are so selected that the wiring electrodes can be electrically connected to another electronic component device such as a transistor in a state where the electronic component device is mounted on the upper surface 2a of the ceramic body 2.

Electrodes 4a to 4e leading to a lower surface 2d of the ceramic body 2 are formed on a side surface 2b of the ceramic body 2. Similarly, electrodes 5a to 5e leading to the lower surface 2d are also formed on a side surface 2c of the ceramic body 2. The electrodes 4a to 4e and 5a to 5e are electrically connected to the above described wiring electrodes 3a to 3e or inner electrodes as described later which are formed inside the ceramic body 2. In addition, several of the electrodes 4a to 4e and 5a to 5e are used as terminal electrodes which are finally electrically connected to the exterior. Furthermore, the electrodes 4a to 4e and 5a to 5e on the side surfaces 2b and 2c are formed so as to lead to the upper surface 2a and the lower surface 2d, as described above. Accordingly, the ceramic substrate 1 according to the present embodiment can be surface-mounted on a printed circuit board or the like. The electrodes 4a to 4e and 5a to 5e may be formed so as to lead to only one of the upper surface 2a and the lower surface 2d.

The above described electrodes 4a to 4e and 5a to 5e are completed as electrodes by applying a conductive paste containing Ag to the side surfaces 2b and 2c and the lower surface 2d of the ceramic body 2 after sintering and baking the conductive paste on the ceramic body 2, similarly to the wiring electrodes 3a to 3e.

Figure 2:
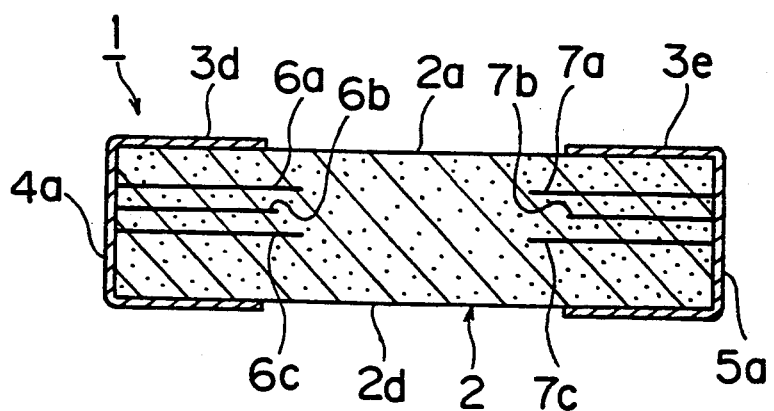
FIG. 2 is a cross sectional view taken along a line II—II shown in FIG. 1.

FIG. 2 is a cross sectional view taken along a line II—II shown in FIG. 1. As apparent from FIG. 2, inner electrodes 6a to 6c and 7a to 7c are formed in positions at different heights while being separated from each other by a ceramic layer in the ceramic body 2. In the present embodiment, the inner electrodes 6a to 6c extend out to the side surface 2b of the ceramic body 2, and are electrically connected to the above described electrode 4a. Similarly, the inner electrodes 7a to 7c extend out to the side surface 2c, and are electrically connected to the electrode 5a. The inner electrodes 6a to 6c and 7a to 7c are provided so as to constitute a multilayer capacitor in the ceramic body 2.

The above described inner electrodes 6a to 6c and 7a to 7c are electrically connected to arbitrary ones of the other electrodes 4b to 4e and 5b to 5e, to constitute a desired electrical circuit, which is not particularly illustrated.

Figure 3:
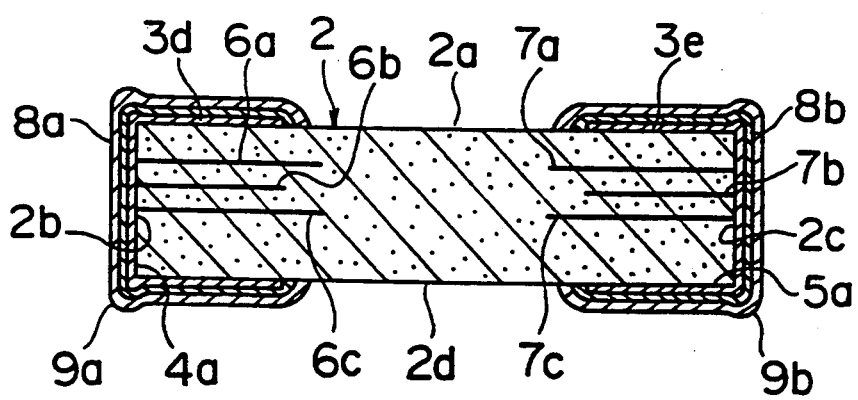
FIG. 3 is a cross sectional view showing one embodiment of the present invention, which shows a state where plating films have been formed in a cross section shown in FIG. 2.

In the ceramic substrate 1 according to the present embodiment, plating films made of the same material are formed on the outer parts of the wiring electrodes 3a to 3e formed on the upper surface 2a of the above described ceramic body 2 and the electrodes 4a to 4e and 5a to 5e formed on the side surfaces 2b and 2c and the lower surface 2d thereof. The construction of the ceramic substrate 1 in which the plating films are formed, that is, the ceramic substrate 1 according to the present embodiment is illustrated in FIG. 3. FIG. 3 is a cross sectional view showing a state where the plating films have been formed in portions corresponding to the cross sectional view of FIG. 2.

As apparent from FIG. 3, first plating layers 8a and 8b formed by electroless plating with Ni are respectively formed on the wiring electrodes 3d and 3e formed on the upper surface 2a. The first plating layers 8a and 8b are also respectively formed on the electrodes 4a and 5a leading to the lower surface 2d formed on the side surfaces 2b and 2c. The first plating layers 8a and 8b are also formed on the other wiring electrodes 3a, 3b and 3c and the other electrodes 4b to 4e and 5b to 5e, which is not particularly illustrated.

Consequently, the first plating layers 8a and 8b made of Ni are applied on the above described wiring electrodes 3a to 3e and the electrodes 4a to 4e and 5a to 5e by carrying out the plating process once.

Furthermore, in the present embodiment, second plating layers 9a and 9b made of Sn are respectively formed by electroless plating with Sn on the outer parts of the above described first plating layers 8a and 8b. The second plating layers 9a and 9b are also applied on the other wiring electrodes 3a to 3c and the other electrodes 4b to 4e and 5b to 5e. Since the second plating layers 9a and 9b are formed on all the wiring electrodes 3a to 3e and the electrodes 4a to 4e and 5a to 5e, the second plating layers 9a and 9b are applied by carrying out the plating process once.

In the ceramic substrate 1 according to the present embodiment, therefore, the first plating layers 8a and 8b made of Ni for preventing Ag from being eroded by solder can be formed by carrying out the plating process once. In addition, the second plating layers 9a and 9b made of Sn for enhancing solderability can be also formed by only carrying out the plating process once. Accordingly, the plating film forming process can be significantly simplified, as compared with the conventional example in which the plating films formed on the electrodes on the major surface and the electrodes on the side surfaces and the lower surface are made of different plating materials.

The ceramic substrate 1 according to the present embodiment shown in FIG. 3 has the second plating layers 9a and 9b made of Sn in its outermost layer. In surface-mounting the ceramic substrate 1 on a printed circuit board or the like, therefore, solderability is enhanced. Consequently, it is possible to enhance mounting strength and reliability of the ceramic substrate 1. Although the ceramic substrate 1 can be directly mounted as a chip component on the printed circuit board or the like as described above, it can be incorporated into an insulating case or the like.

Figure 4:
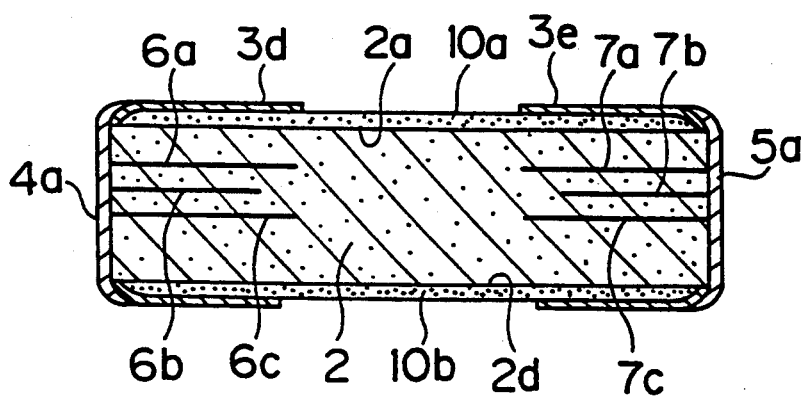
FIG. 4 is a cross sectional view for explaining another electronic component to which the present invention is applied.

Although in the above described embodiment, the wiring electrodes 3a to 3e are directly formed on the upper surface 2a of the ceramic body 2, the present invention is also applicable to a ceramic substrate in which graze layers 10a and 10b made of glass are formed on an upper surface 2a and a lower surface 2d of a ceramic body 2, and wiring electrodes 3d and 3e and electrodes 4a and 5a are formed so as to lead to the graze layers 10a and 10b, as shown in FIG. 4. Specifically, also in the ceramic substrate 1 shown in FIG. 4, first and second plating layers are formed as in the above described embodiment, thereby to make it possible to enhance corrosion resistance and solderability.

Furthermore, although in the above described embodiment, a material constituting the wiring electrodes and the electrodes formed on the side surfaces and the lower surface of the ceramic body is Ag, the material constituting the electrodes may be another metal material such as an Ag-Pd alloy, Cu or Pd.

Additionally, although materials constituting the plating films are Ni and Sn, the materials are only an example. For example, a Pb-Sn alloy, Au, Cu and the like may be used.

In the present embodiment, the wiring electrodes 3a to 3e and the electrodes 4a to 4e and 5a to 5e are simultaneously plated, as described above. Accordingly, it is possible to reduce the variation in the thickness of the plating film formed on each of the electrode portions. Conventionally, in the electrode portion having a small area, the plating film could not be, in some cases, formed to a sufficient thickness. On the other hand, in the present embodiment, a lot of electrodes are formed on the upper and lower surfaces and the side surfaces of the ceramic body. Accordingly, a voltage in the case of electroplating is reliably applied to the wiring electrode and the electrode formed on the side surface which are electrically connected to each other, for example, the wiring electrode 3d and the electrode 4a. Accordingly, in the electrodes, plating films having a sufficient thickness can be reliably formed.

Although in the above described embodiment, description was made of the ceramic substrate 1 having the electronic component devices carried on its upper surface as one example of the ceramic electronic components, the present invention is applicable to electronic components in general having wiring electrodes formed on its major surface and electrodes for electrical connection to the interior or the exterior formed on its side surfaces and/or the other major surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic component comprising:
   a ceramic body having a pair of major surfaces and side surfaces connecting said pair of major surfaces to each other;
   at least one wiring electrode formed on one of the major surfaces of said ceramic body;
   at least one external electrode formed on at least one of the side surfaces and the other major surface of said ceramic body for electrical connection to an interior electrode contained inside the ceramic body or for electrical connection to said at least one wiring electrode; and
   a plating film formed on both said at least one wiring electrode and said at least one external electrode.

2. The electronic component according to claim 1, wherein the at least one external electrode is formed so as to lead to at least one of both the major surfaces of said ceramic body.

3. The electronic component according to claim 2, wherein the at least one external electrode is formed so as to lead to only one of the major surfaces of the ceramic body.

4. The electronic component according to claim 1, wherein the plating film formed on said wiring electrode and said external electrode has a plurality of plating layers.

5. The electronic component according to claim 4, wherein
   said external wiring electrode and said electrode are made of Ag or an Ag system alloy, and
   said plating film comprises a first plating layer made of Ni and a second plating layer formed on the first plating layer and made of Sn.

6. The electronic component according to claim 1, further comprising a plurality of inner electrodes formed in said ceramic body at different heights while being separated from each other by a ceramic layer contained in said ceramic body.

7. The electronic component according to claim 6, wherein a multilayer capacitor unit is constituted by said plurality of inner electrodes in the ceramic body.

8. The electronic component according to claim 7, wherein said plurality of inner electrodes are electrically connected to said at least one external electrode.

9. The electronic component according to claim 6, wherein the at least one external electrode is formed so as to lead to at least one of both the major surfaces of the ceramic body.

10. The electronic component according to claim 9, wherein said at least one external electrode is formed so as to lead to only one of the major surfaces of the ceramic body.

11. The electronic component according to claim 6, wherein the plating film formed on said wiring electrode and said external electrode has a plurality of plating layers.

12. The electronic component according to claim 11, wherein
   said wiring electrode and said external electrode are made of Ag or an Ag system alloy, and
   said plating film has a first plating layer made of Ni and a second plating layer formed on the first plating layer and made of Sn.

13. The electronic component of claim 1, wherein the at least one wiring electrode comprises a first portion extending substantially parallel to the side surfaces of the ceramic body and a second portion extending substantially perpendicular to the side surfaces of the ceramic body, said second portion being wider than said first portion.

14. The electronic component of claim 1, wherein said at least one wiring electrode extends from one of the side surfaces of the ceramic body to a center portion of the ceramic body.

15. The electronic component of claim 1, wherein the at least one wiring electrode extends along at least one half of a width of said one major surface of the ceramic body and is adapted to be electrically connected to an auxiliary electronic component mounted on said one major surface of the ceramic body.

* * * * *